(12) United States Patent
Honer

(10) Patent No.: US 6,822,304 B1
(45) Date of Patent: Nov. 23, 2004

(54) SPUTTERED SILICON FOR MICROSTRUCTURES AND MICROCAVITIES

(75) Inventor: Kenneth A. Honer, Santa Clara, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 255 days.

(21) Appl. No.: 09/710,489

(22) Filed: Nov. 10, 2000

Related U.S. Application Data

(60) Provisional application No. 60/165,013, filed on Nov. 12, 1999.

(51) Int. Cl.[7] .............................................. H01L 29/82
(52) U.S. Cl. ........................................ 257/418; 438/52
(58) Field of Search .............................. 438/48, 50, 52, 438/933; 257/19, 202, 418, 419; 148/33–33.06

(56) References Cited

U.S. PATENT DOCUMENTS

| | | | | |
|---|---|---|---|---|
| 5,025,346 A | * | 6/1991 | Tang et al. ............... | 361/283.1 |
| 5,491,604 A | * | 2/1996 | Nguyen et al. .......... | 331/116 M |
| 5,537,083 A | * | 7/1996 | Lin et al. .................... | 333/186 |
| 5,554,488 A | * | 9/1996 | Rioux .......................... | 216/47 |
| 5,573,679 A | * | 11/1996 | Mitchell et al. ............... | 216/2 |
| 5,578,976 A | * | 11/1996 | Yao ............................. | 200/181 |
| 5,651,900 A | * | 7/1997 | Keller et al. ................. | 210/490 |
| 5,658,698 A | * | 8/1997 | Yagi et al. ..................... | 430/11 |
| 5,660,680 A | * | 8/1997 | Keller .......................... | 216/2 |
| 5,919,364 A | * | 7/1999 | Lebouitz et al. ........ | 210/321.84 |
| 6,046,659 A | * | 4/2000 | Loo et al. .................... | 200/181 |
| 6,103,305 A | * | 8/2000 | Friedmann et al. ...... | 427/249.7 |
| 6,210,988 B1 | * | 4/2001 | Howe et al. ................... | 438/50 |
| 6,294,101 B1 | * | 9/2001 | Silverbrook ................. | 216/27 |
| 6,331,257 B1 | * | 12/2001 | Loo et al. ..................... | 216/13 |

OTHER PUBLICATIONS

Tsu–Jae King et al., "Polycrystalline Silicon–Germanium Thin–Film Transistors," IEEE Transactions on Electron Devices, vol. 41, No. 9, Sep. 1994.

Andrew J. Tang et al., "ANovel Poly–Silicon–Capped Poly–Silicon–Germanium Thin–Film Transistor," IEDM Technical Digest, pp. 513–516, 1995.

Min Cao et al., "Low Pressure Chemical Vapor Deposition of $Si_{1-x}Ge_x$ films on $SiO_2$," J. Electrochem. Soc., vol. 142, No. 5, May 1995.

Julie A. Tsai et al., "Effects of Ge on Material Alnd Electrical Properties of Polycrystalline $Si_{1-x}Ge_x$ for Thin–Film Transistors," J. Electrochem. Soc., vol. 142, No. 9, Sep. 1995.

Kyle S. Lebouitz et al., "Fermeable Polysilicon Etch–Access Windows for Microshell Fabrication," Transducres 1995, pp. 224–227.

(List continued on next page.)

*Primary Examiner*—David Nelms
*Assistant Examiner*—David Vu
(74) *Attorney, Agent, or Firm*—Lumen Intellectual Property Services, Inc.

(57) ABSTRACT

A sputtered silicon layer and a low temperature fabrication method thereof, is introduced. The sputtered silicon layer is sputtered with predetermined sputtering criteria resulting in a predetermined pre-annealing configuration. The sputtering criteria include sputtering power, ambient sputtering pressure, choice of sacrificial layer and etchant. The initially sputtered layer is transformed during a low temperature annealing process into a post-annealing state. A released structure is micro-machined from the sputtered layer in its post-annealed state. The low temperature annealing leaves pre-fabricated integrated aluminum-metalized circuitry unaffected. Optional conductive sputtered co-layers reduce resistivity and may be used to further tune strain and strain gradient.

12 Claims, 3 Drawing Sheets

OTHER PUBLICATIONS

Takeshi Abe et al., "Low Strain Sputtered Polysilicon for Micromechanical Structures," Proc, of Ninth Inernatioal Workshop on Microelectro–Mechanical Systems, San Diego, Feb. 1996, pp. 258–262.

R. T. Howe et al., "Integrated Resonant–Microbridge Vapor Sensor," Proc. IEEE Int. Elect. Dev. Mtg., San Francisco, Dec. 1984, pp. 213–216.

J. H. Smith et al., Embedded Micromechanical Devices for the Monolithic Integration of MEMS with CMOES, Proc. Int. Electron Devices Mtg., Washington, DC, Dec. 1995, pp. 609–612.

D. Samsonov et al., "Particle Growth in a Sputtering Discharge," J. Vac. Sci. Technol. A 17(5) Sep./Oct. 1999.

Vivek Subramanian et al., "Response Surface Optimization for High–Performance Solid–Phase Crystallized Silicon–Germanium Tin Film Transistors," last modified Jan. 21, 1998, retrieved on Jun. 13, 2002. Retrieved from the internet: <URL: http://www–device.eecs.Berkeley.edu/~viveks/papers/127SPIE3014.pdf>.

A. H. Dan et al., "Diffusion Studies of Antimony and Boron in Si and SiGe Under Point Defect Injections by Rapid Thermal Anneal," retrieved on Jun. 13, 2002. Retrieved from the internet: <URL:http://www.ses.soton.ac.k/projects/materials/PGC/AHDan.pdf>.

Zhonghe Jin et al., "High Performance Polycrystalline SiFe Thin Film Transistors Using $Al_2O_3$ Gate Insulator," retrieved on Jun. 13, 2002. Retrieved from the internet: <http://www.ee.ust.hk/~eekwok/publications/1998/idrc 98.pdf>. More Results from: www.ee.ust.hk.

* cited by examiner

SPUTTERED SILICON FOR MICROSTRUCTURES AND MICROCAVITIES

CROSS-REFERENCE TO RELATED APPLICATIONS

This application claims the benefit of U.S. provisional patent application No. 60/165,013, filed on Nov. 12, 1999, which is hereby incorporated herein by reference in its entirety.

STATEMENT REGARDING FEDERALLY SPONSORED RESEARCH OR DEVELOPMENT

This invention was supported in part by contract number F30602-96-2-0308-P0001 from the Defense Advanced Research Projects Agency (DARPA) Composite CAD program and the Air Force Office of Science and Research (AFOSR). The U.S. Government has certain rights in the invention.

FIELD OF INVENTION

This invention relates generally to fabrication of silicon micro mechanical structures. More particularly, it relates to released microstructures made of sputtered silicon that are compatible with pre-fabricated on-chip aluminum circuitry.

BACKGROUND OF INVENTION

Polysilicon has become the material of choice for most surface micro-machined structures due to its excellent mechanical properties and controllable stress. The commonly used process to deposit polysilicon is low pressure chemical vapor deposition (LPCVD), which requires relatively high deposition temperatures of 580–630° C. and annealing temperatures above 900° C. See for instance R. T. Hove and R. S. Muller, Abstract No. 118, Extended Abstracts of the Electrochemical Society Meeting, Montreal, Canada, May, 1982, pp. 184–185; or R. T. Howe and R. S. Muller, "Integrated Resonant-Microbridge Vapor Sensor" Proc. IEEE Int. Elect. Dev. Mtg., San Francisco, December, 1984, pp. 213–216.

Since electronic circuitry is typically heat resistant only up to temperatures below those required for the LPCVD, re-engineering may have to be performed to bring pre-fabricated circuitry into operational condition unless the metal layers are deposition after the polysilicon deposition as is described for example in J. H. Smith, et al., "Embedded micromechanical devices for the monolithic integration of MEMS with CMOES," Proc. Int. Electron Devices Mtg., Washington, D.C., December, 1995, pp. 609–612.

Another alternative is to use refractory metals such as tungsten instead of aluminum as is described, for example in J. M. Bustillo, et al., "Process technology for modular integration of CMOS and polysilicon microstructures," Microsystem Technologies, Vol. 1, 1994, pp.30–41. These approaches increase the overall fabrication complexity.

The integration of microstructures and electronic circuitry is vital to the performance of many surface micro-machined sensors, since as dimensions decrease, sensitivity often falls off precipitously. The sensitivity of a torsional capacitive accelerometer, for example, scales with the fifth power of the lateral dimension of it.

Stresses and strain gradients can limit the performance of both integrated and passive electrostatic MEMS devices. If the in-plane residual stress in doubly supported structures, for example, is too large, the structures may buckle. Conversely, if the stresses are too large the mechanical stiffness may be too large for the intended application. Stress control in sputtered structures has been achieved previously with high temperature anneals as is described, for example, in T. Abe and M. L. Reed, "Low Strain Sputtered Polysilicon for Micromechanical Structures," Proc. of Ninth International Workshop on Micro Electro-Mechanical Systems, San Diego February, 1996, pp. 258–262. These high temperature anneals (>1000° C. exceed their thermal annealing budget critical thermal budgets of integrated circuitry. The critical thermal budget is the budget beyond which the configuration of the integrated circuitry becomes permanently changed.

The presence of strain gradients in deposited films causes released structures to warp. If the warpage is severe, the structures may touch the substrate, rendering them immobile. Alternatively, if the structures warp away from the substrate, capacitances of the structures diminish. Strain gradients result from initially sputtered silicon forming clusters on top of the sacrificial layer before reaching a closing thickness at which the sputtered silicon clusters have laterally extended and sufficiently overlapped to form a solid layer. The closing thickness is within several 100 Angstroms. The sputtered silicon within that closing thickness has a specific internal stress that differs significantly from the internal stress of the silicon deposited above the closing thickness. The phenomenon of the differing internal stress within the closing thickness is known to those skilled in the art as coalescence. The closing thickness is highly constant and introduces an essentially constant coalescence strain to the final structure. With increasing overall thickness of the micro-machined structure the influence of the coalescence strain becomes less influential. Depending upon the application, several additional properties may be important for the structural layer of a micro-fabricated device. Among these characteristics are film density, surface roughness and electrical resistivity, and permeability.

Thin layers of polysilicon are permeable to HF based etches as is described, for example, in K. S. Lebouitz, R. T. Howe, and A. P. Pisano, "Permeable Polysilicon Etch-Access Windows for microshell Fabrication" Transducres '95, pp. 224–227. Unfortunately, the layer thickness useful for creating solid enclosed cavities are too thin for extended mechanical application and require additional reinforcing layers. In particular, the capillary force of the etch requires a minimal thickness of the permeable layer to prevent a collapsing of the cavity cover. To prevent collapsing during wet etching, a critical point drying has to be performed, where the wet etch is frozen and then evaporated.

The inventive utilization of low temperature sputtering techniques for depositing silicon layers makes the use of organic materials for sacrificial layers possible. Such an organic material is preferably polyimide, which can be etched and removed by the use of a dry etch or dry plasma etch where capillary forces do not occur.

OBJECTS AND ADVANTAGES

It is a primary object of the present invention to provide a micro-machined structure that can be fabricated non destructively to and in combination with pre-fabricated aluminum-metalized electronic circuitry.

It is another object of the present invention, to provide a method for making the micro-machined structure with tunable in-plane strain and strain gradient.

It is a further object of the present invention, to provide a micro-machined structure with predetermined levels of electric conductivity.

It is also an object of the present invention to provide a micro-machining process that employs a dry-release of the resultant micro-structure.

Finally, it is an object of the present invention, to provide a micro-machined structure with a porosity for creating encapsulated cavities with sufficiently thick cavity cover layers.

SUMMARY

A sputtered layer is introduced. The sputtered layer, preferably from silicon, is deposited with predetermined sputtering criteria resulting in a predetermined pre-annealing configuration. This pre-annealing configuration is transformed during a low temperature annealing process into a post-annealing configuration. A released structure is micro-machined from the sputtered layer in its post-annealed configuration.

The fabrication process includes the initial deposition of a sacrificial layer, for example, phosphosilicate glass (PSG) or polyimide resin beneath the following layers predetermined for the released structure. The sacrificial layer is removed in a final fabrication step to the extent necessary to release the previously patterned structure.

The released structure has a resulting in-plane strain and a resulting strain gradient, which are predetermined in accordance with deformation configurations of the released structure. The deformation configuration depends on the shape of the released structure and on the fashion it is supported. The deformation configurations are distinguished between an essentially buckling-free deformation configuration and an essentially buckling-influenced deformation configuration. The buckling-free deformation configuration is, for example, a beam supported on one end. The buckling influenced deformation configuration is, for example a straight beam rigidly supported on both ends. In other words, the buckling-free deformation configuration is the case where the buckling principles according to Euler are not applicable; the buckling-influenced deformation configuration is the case where the buckling principles according to Euler have to be applied.

In the case, where a low temperature annealing is included in the fabrication of the released structure, the resulting in plane strain and the resulting strain gradient are only an initial in-plane strain and an initial strain gradient, which are transformed during the annealing into a residual in-plane and a residual strain gradient. Resulting in-plane strain/strain gradient and initial in-plane strain/strain gradient may differ, since the low temperature annealing allows an additional adjustment of them independently from the sputtering. Thus, sputtering criteria defined to deposit the silicon, may be more broadly selected when a low temperature annealing is included in the fabrication of micro-machined structures. The low temperature annealing is an optional fabrication step.

For buckling-free deformation configurations, first sputtering criteria predominantly include sacrificial layer etchant selection and sputtering layer thickness are defined such that the sputtered layer has a predetermined resulting or initial strain gradient. In the case, where a low temperature annealing is included in the fabrication process, the first sputtering criteria are selected in correlation with the annealing transformation.

For buckling-influenced deformation configurations, second sputtering criteria predominantly include and sacrificial layer material are defined such that the sputtered layer has a predetermined resulting or initial in-plane strain. Sputtering power, ambient sputtering pressure and sputtering temperature are selected from a zone-T of the Thornton zone diagram as known to those skilled in the art. In the case, where a low temperature annealing is included in the fabrication process, the second sputtering criteria are selected in correlation with the annealing transformation.

The low temperature annealing is performed with a thermal annealing budget, which includes sufficiently low maximum temperatures and sufficiently short annealing duration such that pre-fabricated integrated electronic circuitry is not permanently altered by the annealing. Thus, integrated electronic circuitry like, for example, aluminum-metalized circuitry or aluminum-metalized CMOS, can be fabricated and brought into operational condition on the same work piece or chip prior to the making of the micro-machined structure.

To adjust the electric conductivity of the micro-machined structure, a multi layer including a silicon core layer and at least one conductive layer with high electric conductivity are combined. The conductive layer has a dissolving characteristic that is compatible with the dissolving characteristic of the core layer. The dissolving characteristic includes an etching rate at which material of the multi layer structure is removed for a first group of etchants, selected to etch the multi layer structure. The dissolving characteristic includes further an etchant resistance against a second group of etchants, selected to etch the sacrificial layer. The compatible dissolving characteristic of the individual layers of the multi layer allows a simultaneous etch forming of the released structure from the multi layer. In the case where the core layer is made from silicon, the secondary layer(s) may be a Titanium based material such as TiW or TiN.

The sputtered layer made from silicon is porous and permeable to HF-based etches at approximately ten times the thicknesses reported for LPCVD deposited polysilicon. The initial porosity remains mostly unaltered during the annealing process such that encapsulated cavities with relatively thick cover layers may be fabricated compared to those made from polysilicon. Consequently, larger and/or more solid cover layers may be fabricated compared to those from prior art methods. *The cover layers are stiffer and better able to withstand the capillary forces of the wet etch in the encapsulated cavity beneath the silicon during a drying process. The annealing need not be performed prior to the release etching.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Fabrication processes for micro-machined structures according to the present invention are illustrated in the FIGS. 1–4 and 6–9. The contents of FIGS. 1–4 and 6–9 is simplified and without any claim of dimensional or proportional accuracy and serves solely to give an understanding of the inventive steps of the present invention.

The fabrication example described in the FIGS. 1–4 is for a fabrication process including a low temperature annealing. It is clear to one skilled in the art that the scope of the invention is not limited by the inclusion of a low temperature annealing.

Figure 1:
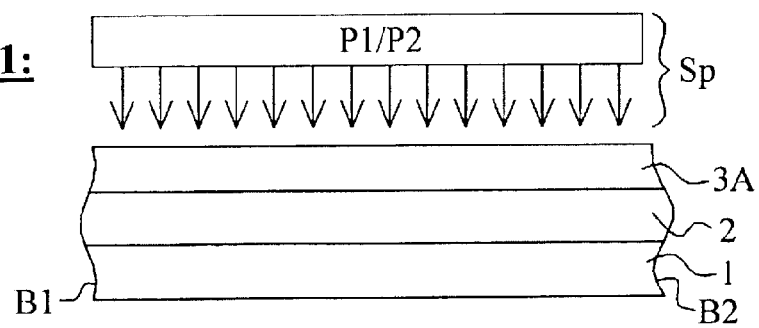
FIG. 1 shows a simplified section of a work piece during the sputtering process.

FIG. 1 shows a simplified section of a work piece during the sputtering process. The work piece may be a substrate or any structure including a substrate known to those skilled in the art as a base for micro-machined structures and electronic circuitry. The work piece is a unit undividedly exposed to the fabrication steps required for fabricating micro-machined structures including a thermal annealing process. The work piece may include pre-fabricated electronic circuitry having a critical thermal budget beyond which the circuitry configuration becomes permanently altered. The critical thermal budget is defined by exposure temperature and exposure duration as is known to those skilled in the art.

The simplified section of FIG. 1 is shown between the breaking lines B1 and B2 having a substrate 1 with a sacrificial layer 2 on top of the substrate 1. On top of the sacrificial layer 2 is the initial sputtered layer 3A deposited by the sputtering process Sp.

The sputtering process Sp is either defined by first sputtering criteria P1 or by second sputtering criteria P2. The first sputtering criteria P1 provide an initial sputtered layer 3A having a first pre-annealing configuration including a predetermined initial strain gradient. The second set of sputtering criteria provides the initial sputtered layer 3A having a second pre-annealing configuration including a predetermined initial in-plane strain. The sputtering process should be of zone-T type to ensure that low stresses are achieved. The deposition temperature should thus be approximately between room temperature and 200° C. An Ar working gas deposition pressure ranging from 8 to 14 mTorr yielded acceptable stresses. Films deposited at 8 mTorr were more dense. Those deposited at 14 mTorr were more porous. Deposition powers of between 1.5 and 2.5 kW were used.

Please note that much of these results are machine specific, which may vary between various types of sputtering machines as is well known to those skilled in the art. Zone-T type sputtering is a sputtering according to the Thornton zone diagram as is well known to those skilled in the art.

Figure 2:
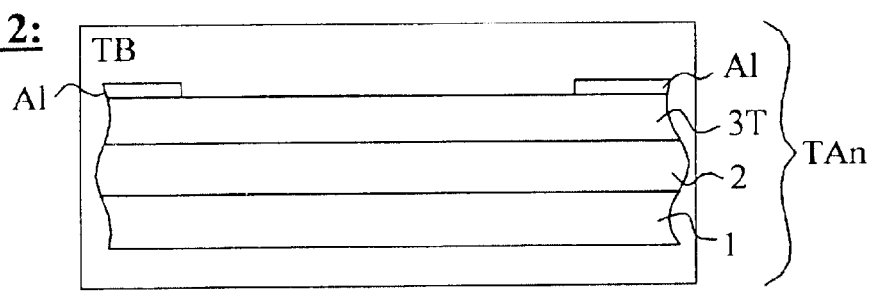
FIG. 2 shows a simplified section of the work piece of FIG. 1 during the annealing process.

FIG. 2 shows a simplified section of the work piece of FIG. 1 during the annealing process. The simplified section of FIG. 2 features optional aluminum terminals Al, which may be deposited after the deposition of the initial sputtered layer 3A and before the work piece is exposed to a low temperature annealing process TAn indicating in FIG. 2 a rectangle labeled TB for a thermal annealing budget TB induced on the work piece during the low temperature annealing process TAn. The definition of the thermal annealing budget TB includes a maximum annealing temperature and an annealing duration. The thermal annealing budget TB is smaller than the critical thermal budget of eventual electronic circuitry of the work piece simultaneously exposed to the low temperature annealing process TAn. The films were annealed in nitrogen and a nitrogen-hydrogen environment at temperatures at or below 350° C. The films annealed in the nitrogen-hydrogen environment showed a marked decrease in conductivity and a decrease in the strain gradient.

During the low temperature annealing process TAn, the initial sputtered layer 3A is transformed into a layer 3T having a transformed structure.

Figure 3:
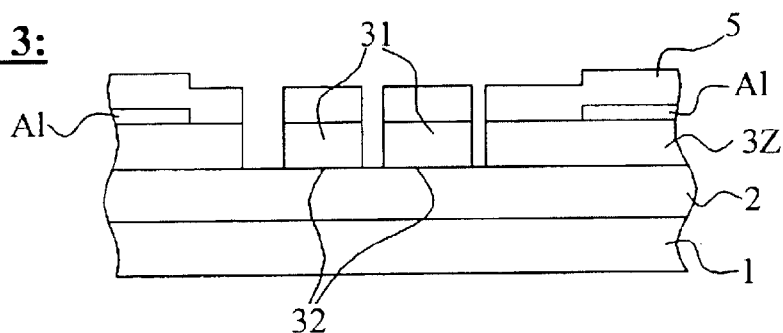
FIG. 3 shows a simplified section of the work piece of FIG. 1 after the patterning of micro-machined structures.

FIG. 3 shows a simplified section of the work piece of FIG. 1 after the patterning of micro-machined structures 31. The patterning is accomplished by a first etching through the gaps of an etching mask 5 deposited after the low temperature annealing process TAn. The micro-machined structures 31 are shaped from the residual sputtered layer 3Z, which is the result of the transformed layer 3T after the low temperature annealing process TAn.

The residual sputtered layer 3Z may have predetermined first post-annealing configuration with a residual strain gradient that results from the first pre-annealing configuration in combination with the predetermined transformation taking place in the transforming layer 3T.

The residual sputtered layer 3Z may have a predetermined second post-annealing configuration with a residual in-plane strain that results from the second pre-annealing configuration in combination with the predetermined transformation taking place in the transforming layer 3T.

The residual sputtered layer 3Z is patterned using standard semiconductor processing techniques.

Figure 4:
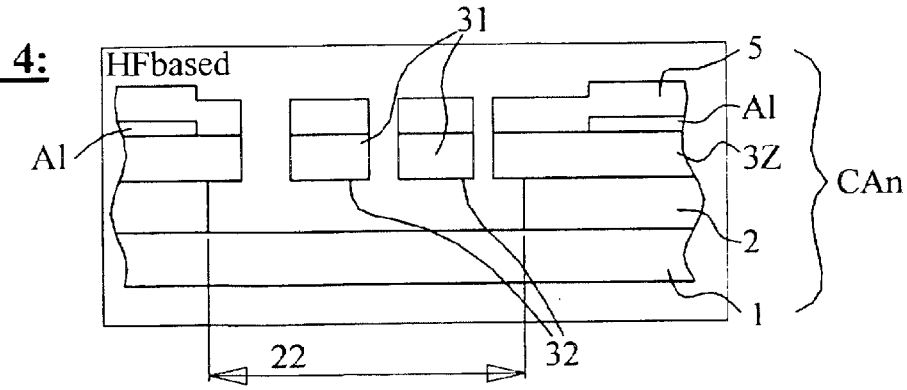
FIG. 4 shows a simplified section of the work piece of FIG. 1 after the releasing of the micro-machined structures of FIG. 3.

FIG. 4 shows a simplified section of the work piece of FIG. 1 after releasing the micro-machined structures 31 of FIG. 3. The release is accomplished by dissolving the release area 22 of the sacrificial layer 2 in an etching process that preferentially effects only the sacrificial layer 2. Consequently, the remaining contacting surfaces 32 are not contacting the sacrificial layer 2 anymore and the micro-machined structures 31 are released.

The micro-machined structures 31 may have either an essentially buckling-free deformation configuration or an essentially buckling-influenced deformation configuration. In case of the buckling-free deformation configuration, the likelihood for buckling of the released structures 31 is neglect able. In case of the buckling-influenced deformation configuration, the likelihood of buckling according to the buckling laws of Euler is a dominant deformation threat of the released micro-machined structures 31.

For buckling-free deformation configurations, first sputtering criteria are selected.

For buckling-influenced deformation configurations, second sputtering criteria are selected.

It is clear to one skilled in the art that the low temperature annealing process may be performed not only before the first etching process but also prior or after other above described fabrication steps in a feasible fashion.

In the preferred embodiment of the invention, the substrate 1 is made from silicon and the initial sputtered layer 3A is made from silicon preferably doped with 40–80 ppm boron. The boron doping improves electrical conductivity and increases the sputtering rate. The substrate 1 may be made from silicon alone. The electronic circuitry may include aluminum-metalized semiconductors such as CMOS.

The sacrificial layer 2 may be preferably phosphosilicate glass (PSG) with a phosphorous content of 8%. The sacrificial layer 2 may also be polyimide resin, undoped low-temperature oxide (LTO) or any other material known to those skilled in the art being suitable as sacrificial layer material. PSG is preferably selected for the sacrificial layer 2 for wet released processes because of its higher HF etch rate relative to undoped low temperature oxide. Since the sputtered silicon is permeable to HF-based etchants, there need be no direct path to the underlying sacrificial oxide layer for etching to take place.

In the extreme case, where another micro-machined structure forms a solid cover on top of a dedicated released area 22, the etching solvent reaches the sacrificial layer through the porous structure of the residual sputtered layer 3Z.

HF-based etchants are preferably 6:1–20:1 buffered HF or $NH_4HF+HC_2H_3O_2+H_2O$ (pad etch or PAD). The permeability rate for these HF-based etchants through sputtered silicon is shown in the first table below. The permeability rate is related to the time needed to etch the underlying sacrificial layer of PSG. The first table below shows, that sacrificial layers are dissolvable through sputtered silicon at least 5.0 μm thick.

| thickness of sputtered silicon membrane | Time for 6:1 buffered HF | Time for 20:1 buffered HF | Time for PAD |
| --- | --- | --- | --- |
| 0.6 μm | 15 min | 55 min | 20 min |
| 2.0 μm | 15 min | 55 min | 20 min |
| 5.0 μm | 15 min | 55 min | 20 min |

After creating the released area 22, which may be an enclosed cavity, the permeability of the residual sputtered layer 3z may be compensated by coating the residual sputtered layer 3Z with a sealant like, for example, $Si_3N_4$.

Where sufficient access is given to the sacrificial layer 2, a dry etch such as oxygen plasma may be used to create the released area 22. In such a case, polyimide resin may be used for the sacrificial layer 2. This has advantages over oxide sacrificial layers in that the CMOS circuitry does not need to be protected during the release and special drying techniques are not required to prevent capillary forces from permanently pulling the microstructures to the substrate.

The initial sputtered layer 3A may be deposited with a predetermined sputtered layer thickness, which influences the initial strain gradient. Initial and residual strain gradient are further influenced by the selected etchant used in the later fabrication step to remove the sacrificial layer 2 in order to provide the released area 22. The HF etch attacks the grain boundaries, changing the stress at those points. This strain altering effect that takes place during HF etching is indicated with the surrounding rectangle label with, "Hfbased". The following second table shows strain gradients expressed as curvature radii resulting from deformations related to the strain gradients in released straight test structure. The test structures are fabricated according to the description above.

The influence of wet etchants versus dry etchants is illustrated, whereby wet etchants may preferably be $NH_4HF+HC_2H_3O_2+H_2O$ or 6–20:1 buffered HF. The table below shows, that the curvatures get smaller essentially as the square of the sputtered layer thickness for otherwise constant remaining first sputtering criteria.

| Sputtered Layer Thickness | Curvature of initial test structure ($mm^{-1}$) | Curvature of 350C annealed test structure ($mm^{-1}$) |
| --- | --- | --- |
| 0.6 μm | Wet release: 0.50 +/− 0.09 Dry release: −1.21 +/− 0.06 | Wet release: 0.27 +/− 0.13 |
| 2.0 μm | Wet release: 0.04 +/− 0.01 Dry release: −0.20 +/− 0.06 | Wet release: 0.01 +/− 0.02 |
| 5.0 μm | Wet release: 0.01 +/− 0.03 Dry release: 0.01 +/− 0.01 | Wet release: 0.01 +/− 0.02 |

Wet release used in combination with oxide sacrificial layers and HF-based etchants
Dry release used in combination with polyimide sacrificial layers and an Oxygen plasma etchant.

For curvature radii much greater than the film thickness, the average strain gradient in the released structures is merely the inverse of the curvature radius and is seen to decrease with increasing thickness and low temperature annealing.

The secondary sputtering criteria for sputtered boron doped silicon are preferably a first sputtering power in the range of 1.5–2.5 kW, a working gas pressure of 8–14 mTorr argon, as well as the sputtered layer thickness and the selected sacrificial layer material. For these second sputtering criteria, the sputtering rate ranges between 19–37 nm/min. The power is spread over a target area of approximately 6 by 10 inches.

Experimentation has shown that the initial in-plane strain is influenced by the sacrificial layer material on which the boron doped silicon is sputtered. The third table below shows the initial strain values for second sputtering criteria including the combination of sputtered silicon deposited on PSG. This table is a function of the stress as a function of deposition settings rather than a function of substrate type.

| Power | Stress for 8 mTorr | Stress for 14 mTorr |
| --- | --- | --- |
| 1.5 kW | 97 MPa Tensile | 106 MPa Tensile |
| 2.5 kW | 27 MPa Tensile | 133 MPa Tensile |

The fourth table below shows the initial strain values for second sputtering criteria including the combination of sputtered silicon deposited on bare silicon.

| Power | Stress for 8 mTorr | Stress for 14 mTorr |
| --- | --- | --- |
| 1.5 kW | 34 MPa Tensile | 141 MPa Tensile |
| 2.5 kW | 22 MPa Compressive | 164 MPa Tensile |

The fifth table below shows initial and residual strain values for varying boron doped silicon layer thickness sputtered with a sputtering power of 2.0 kw and an ambient sputtering pressure of 9.5 mTorr. The values of the fourth table are illustrated for a defined low temperature annealing process at 350° C. for 3 hours in forming gas in the preferred configuration of 1:9 $H_2:N_2$.

| Sputtered layer thickness | Initial stress value | Residual stress values |
|---|---|---|
| 0.6 μm | 95–108 MPa Tensile | 95–117 MPa Tensile |
| 2.0 μm | 102–107 MPa Tensile | 69–76 MPa Tensile |
| 5.0 μm | 110–117 MPa Tensile | 74–77 MPa Tensile |

To prevent buckling of released micro-machined structures supported in a buckling critical fashion as is known to those skilled in the art, residual in-plane strain needs to be tensile. In case, where the residual in-plane strain remains compressive, below a buckling threshold.

An initial surface roughness as part of the pre-annealing configuration is in a predetermined relation to a residual surface roughness as part of the post-annealing configuration. Surface roughness is an important consideration for bearing and optical surfaces. The sixth table below shows the exemplary surface roughness of three wafers of varying sputtered silicon thickness, before and after low temperature annealing at 350° C.:

| Sputtered layer thickness | Initial surface roughness | Residual surface roughness |
|---|---|---|
| 0.6 μm | 4.2 nm | 3.0 nm |
| 2.0 μm | 4.9 nm | 3.1 nm |
| 5.0 μm | 5.9 nm | 4.9 nm |

An initial electrical resistivity as part of the pre-annealing configuration is in a predetermined relation to a residual electrical resistivity as part of the post-annealing configuration. The seventh table below shows the initial electrical resistivity and the residual electrical resistivity for varying sputtered layer thickness.

| Sputtered layer thickness | Initial electrical resistivity | Residual electrical resistivity |
|---|---|---|
| 0.6 μm | 50 MΩ/□ | 125 GΩ/□ |
| 2.0 μm | 20 MΩ/□ | 20 GΩ/□ |
| 5.0 μm | 7 MΩ/□ | 6 GΩ/□ |

The table shows, that the residual electrical resistivity is significantly higher than the initial electrical resistivity. For applications where a low residual electrical resistivity is required, one or more additional layers of a highly conductive material may be sputtered on top and/or below the sputtered layer. FIGS. 6–9 illustrate schematically an exemplary fabrication process including the sputtering of a conductive bottom layer Ti1 (see FIGS. 8, 9) and a conductive top layer Ti2 (see FIGS. 8, 9).

Figure 8:
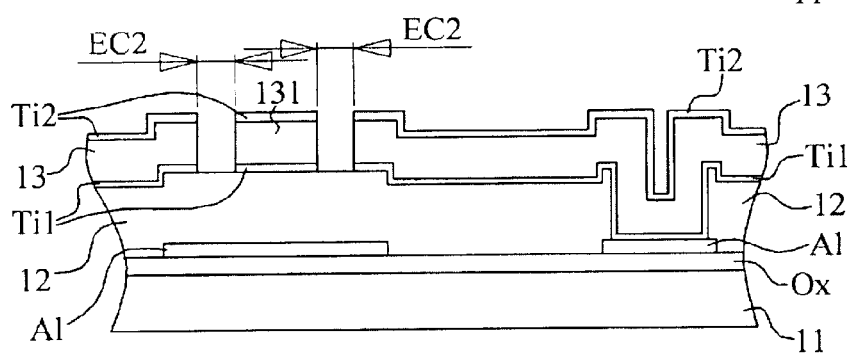
FIG. 8 shows a simplified section of the work piece of FIG. 7 after the sputtering of structural films on top of a patterned sacrificial layer. Three films are shown. A primary structural layer and two secondary layers are used to improve conductivity, sculpt stress, in-plane strain and strain gradient.
Figure 9:
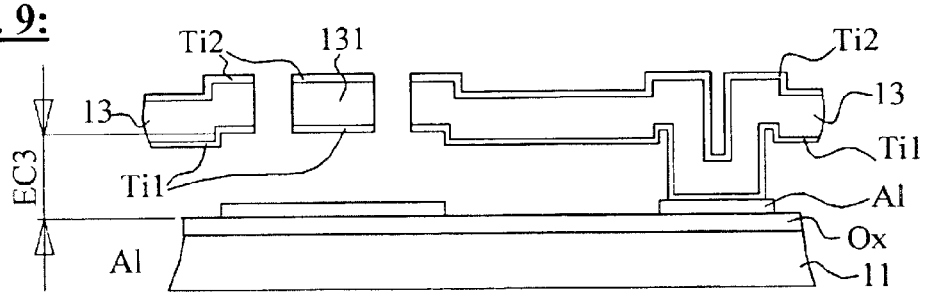
FIG. 9 shows a simplified section of the work piece of FIG. 8 after the release of the micro-machined multi-layer structure.

The conductive bottom and top layers Ti1, Ti2 may be patterned in the same etchant as the resistive sputtered silicon core layer 13 (see FIG. 8). The compatible dissolving characteristic of the bottom layers Ti1, Ti2 and the core layer 13 allow a simultaneous etching to shape the micro-machined structure 131 (see FIGS. 8, 9).

The bottom and/or the top layer Ti1, Ti2 may be sputtered with differing sputtering criteria resulting in predetermined differing residual in-plane strain and/or differing residual strain gradients that differ from the residual core strain and residual core strain gradient. Hence, the post-annealing residual strain gradient and or in-plane strain of the released structure 131 may be adjusted by using differing sputtering criteria.

Figure 5:
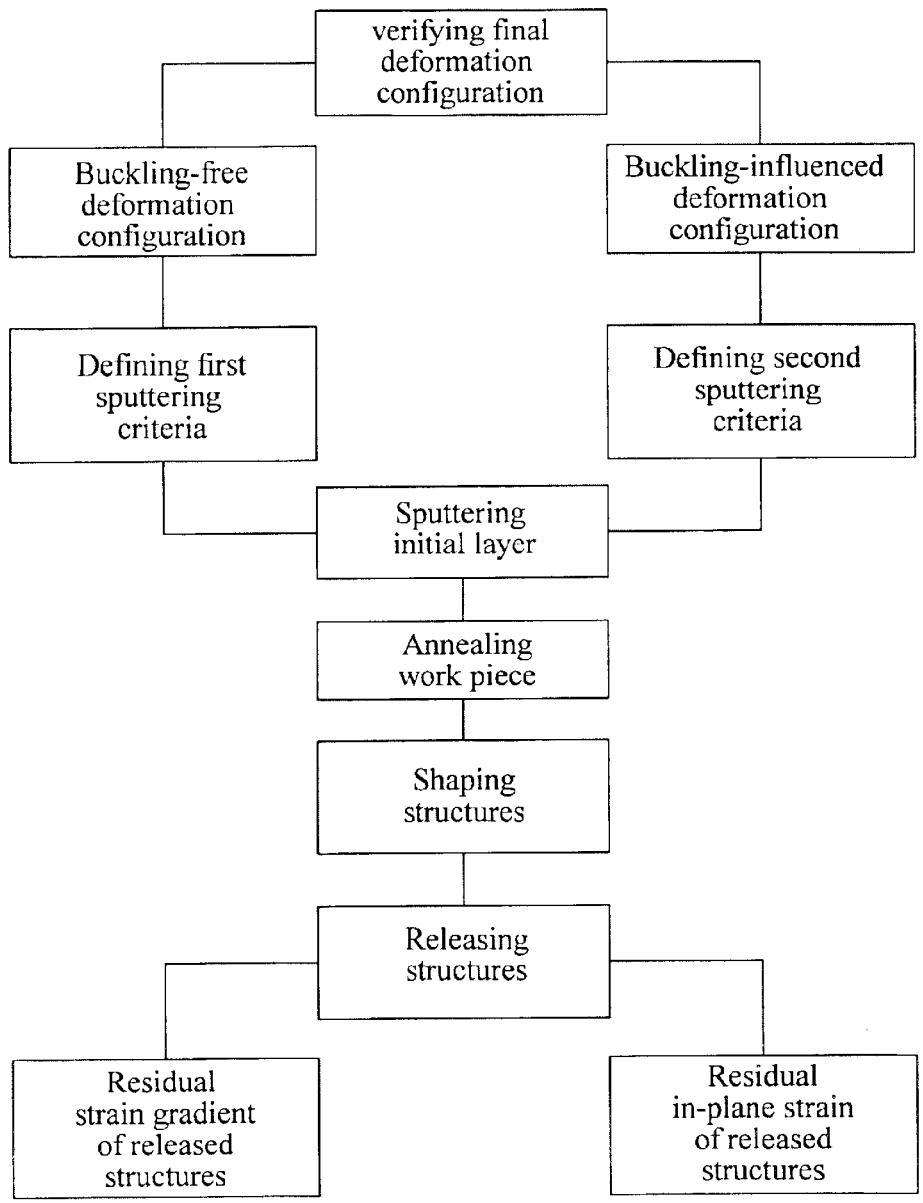
FIG. 5 shows a simplified block diagram showing the fabrication steps of the present invention.

FIG. 5 shows a simplified block diagram illustrating the alternating selections of sputtering criteria dependent on the deformation configuration of the micro-machined structures. After designing a micro-machined structure, it is determined whether Euler's buckling principles need to be considered or not. In case they do, for example for a micro-machined structure in the form of a straight beam rigidly supported on both ends, the buckling-influenced deformation configuration is recognized and second sputtering criteria are selected. After releasing the micro-machined structure, it has a residual in-plane strain within a range where no buckling occurs. In the case, where Euler's buckling principles do not apply, for example for a micro-machined structure in the form of a straight beam rigidly supported only on one end, the first sputtering criteria are selected. After releasing the micro-machined structure, it has a residual strain gradient within a range where residual deformation remains within a predetermined limit.

Figure 6:
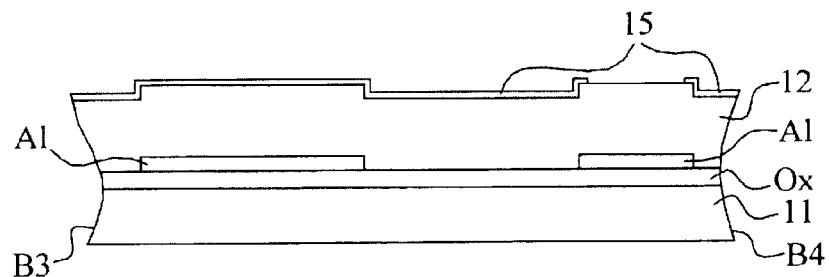
FIG. 6 shows a simplified section of a work piece with aluminum-metalized circuitry elements with a sacrificial layer and an aluminum hard mask on top of it.

FIG. 6 shows a simplified section between the breaking lines B3 and B4 of a work piece 11 according to an embodiment of the present invention of multi layered micro-machined structures. The work piece 11 has aluminum-metalized circuitry elements Al on top of an oxidized layer Ox covered with a sacrificial layer 12 with an aluminum hard mask 15 on top of it. The sacrificial layer 12 is preferably a polyimide resin, spun on, cured and etched back to 2.0 μm. The curing is performed at 350° C. for 1 hr. the thermal curing budget of the curing process is below the critical thermal budget.

Polyimide may be patterned via an aluminum hardmask 15 or by other techniques as are known to those skilled in the art. The aluminum hard mask 15 may be of 200 nm thickness. Due to the back etching of the sacrificial layer 12, the aluminum hard mask 15 may have an improved adhesion to the sacrificial layer 12. The aluminum hard mask 15 is patterned for a following primary etching EC1 (see FIG. 7) of contact vias. To reduce the risk of overetching or undercut etching, a photoresist used to pattern the aluminum hard mask 15 (not shown) is not removed prior to the first etch in order to provide a more uniform loading during the etch. In addition, the anisotropy of the oxygen plasma etch may be increased by reducing the pressure to a practical limit of a commonly used plasma etcher. This level may be, for example, 100 mTorr.

Figure 7:
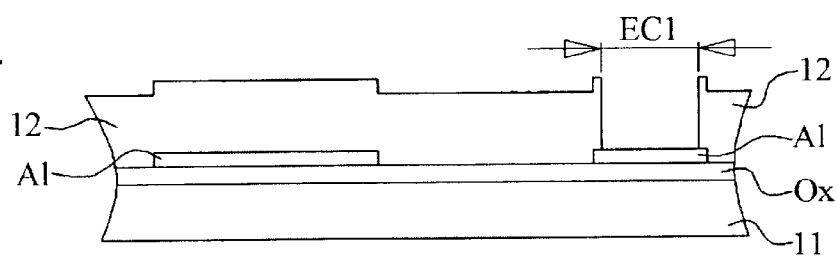
FIG. 7 shows a simplified section of the work piece of FIG. 6 after a primary patterning of the vias in the sacrificial layer used for anchoring the microstructure to the substrate.

FIG. 7 shows a simplified section of the work piece of FIG. 5 after a primary etching. The aluminum hard mask 15 is removed by an aluminum wet etch.

In a following step, the conductive bottom layer Ti1 in the form of low stress TiW with σ< 100 MPa may be sputtered in a thickness of 50 nm. On top of the conductive bottom layer Ti1 is the sputtered core layer 13, in this example sputtered from silicon with a thickness of 2.0 μm. On top of the sputtered layer 13 is the conductive top layer Ti2, in this example sputtered also from the same material as the conductive bottom layer Ti1 with the same thickness of 50 nm.

Due to the symmetric configuration of the multi layer including the conductive bottom and top layers Ti1, Ti2 and the core layer 13 between, bimorph effects are kept to a minimum.

After applying a defined low temperature annealing process with a maximum temperature of 300° C. for about 1 hr, the multi layer may be exposed to a secondary etching process EC2 (see FIG. 8), which may be performed by the use of $SF_6$-$C_2ClF_5$ plasma. During the secondary etching process EC2, the multi layer structure 131 is defined.

The electrical resistivity of the multi layer structure 131 may be about 25 Ω/□.

In a tertiary etching process, EC3 (see FIG. 9) the sacrificial layer 12 is dissolved.

With the fabrication method described in the FIGS. 6–9, various integrated structures including mechanical elements and electronic circuitry may be fabricated. For example, an electrostatically actuatable test structure combined with a CMOS capacitance test circuitry may be fabricated. The threshold shifts in nmos and pmos transistors of the prefabricated CMOS remain essentially unaltered during the consecutive fabrication of the micro-machined structures.

The fabrication of sputtered silicon structures is accomplished with a thermal fabrication budget including a thermal sputtering budget and a thermal annealing budget for the optional low temperature annealing process. The thermal fabrication budget is lower than a first critical thermal budget of eventual circuitry and/or a second critical thermal budget of the sacrificial layers 2, 12. As a result, sacrificial layers 2, 12 may be made from organic material such as polyimide that are dissolvable with a dry etch such as oxygen plasma and stiction of the released structure due to the capillary forces of a drying wet etchant is avoided.

Accordingly, the scope of the invention described in the specification above is set forth by the following claims and their legal equivalent:

What is claimed is:

1. A structure comprising:

a structural layer having a core sputtered silicon layer patterned with released structures thereof;

a first conductive layer in contact with and on top of said core sputtered silicon layer; and a second conductive layer in contact with and below said core sputtered silicon layer, wherein said first and second conductive layers have essentially the same shape as said core sputtered silicon layer; and a complimentary metal oxide semiconductor circuitry integrated with said structural layer, wherein said semiconductor circuitry has a metalized circuitry layer on top of an oxidized layer of a substrate.

2. The structure of claims 1, wherein at least one of said first and second conductive layers is made from a Titanium based material.

3. The structure of claim 2, wherein said Titanium based material is selected from a group consisting of TiW and TiN.

4. The structure of claim 1, wherein said core sputtered silicon layer has a first dissolving characteristic and at least one or both of said first and second conductive layers has a second dissolving characteristic and wherein said second dissolving characteristic is compatible with said first dissolving characteristic.

5. The structure of claim 1, wherein said semiconductor circuitry includes an aluminum-based metalization.

6. The structure of claim 1, wherein said structure has a variable sputtered layer thickness and a correlated curvature, wherein said correlated curvature essentially decreases with an increase of the variable sputtered layer thickness.

7. A structure comprising:

a substrate;

a sacrificial layer on top of said substrate;

a core sputtered silicon layer on top of said sacrificial layer, wherein said core sputtered silicon layer is patterned with released structures thereof;

a released area defined by said substrate, said sacrificial layer, and said core sputtered silicon layer;

metalized circuitry elements on top of said core sputtered silicon layer; and at least one sealing layer covering said released area.

8. The structure of claim 7, wherein said at least one sealing layer is silicon nitride.

9. The structure of claim 1 or 7, wherein said core sputtered silicon layer is made from boron doped silicon.

10. The structure of claim 1 or 7, wherein said core sputtered silicon layer is made from silicon doped with 40–80 ppm boron.

11. The structure of claim 1 or 7, wherein said released structures are essentially buckling-free.

12. The structure of claim 1 or 7, wherein said core sputtered silicon layer has a predetermined thickness which influences a strain gradient of said structure.

* * * * *